United States Patent
Lehr et al.

(10) Patent No.: US 6,803,612 B2
(45) Date of Patent: Oct. 12, 2004

(54) INTEGRATED CIRCUIT HAVING ELECTRICAL CONNECTING ELEMENTS

(75) Inventors: Matthias Uwe Lehr, Dresden (DE); Jens Möckel, Müchen (DE); Dirk Többen, Müchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/662,795

(22) Filed: Sep. 15, 2003

(65) Prior Publication Data

US 2004/0057301 A1 Mar. 25, 2004

Related U.S. Application Data

(63) Continuation of application No. PCT/DE02/00822, filed on Mar. 7, 2002.

(30) Foreign Application Priority Data

Mar. 15, 2001 (DE) .......................................... 101 12 543

(51) Int. Cl.[7] .............................................. H01L 29/73
(52) U.S. Cl. ........................ 257/209; 257/208; 257/210; 257/211
(58) Field of Search ................................ 257/208, 209, 257/210, 211

(56) References Cited

U.S. PATENT DOCUMENTS

| | | | | |
|---|---|---|---|---|
| 5,636,172 A | | 6/1997 | Prall et al. | |
| 5,760,674 A | * | 6/1998 | Gilmour et al. | 337/297 |
| 5,949,323 A | * | 9/1999 | Huggins et al. | 337/401 |
| 5,986,321 A | | 11/1999 | Froehner | |
| 6,096,580 A | * | 8/2000 | Iyer et al. | 438/132 |
| 6,172,896 B1 | | 1/2001 | Lee | |
| 6,225,652 B1 | * | 5/2001 | Devanney | 257/209 |
| 6,291,844 B1 | * | 9/2001 | Aoki | 257/209 |
| 6,486,527 B1 | * | 11/2002 | MacPherson et al. | 257/529 |
| 6,541,290 B1 | * | 4/2003 | Bang et al. | 438/22 |
| 6,597,054 B1 | * | 7/2003 | Prall et al. | 257/529 |

FOREIGN PATENT DOCUMENTS

EP 1 045 441 A2 10/2000

* cited by examiner

Primary Examiner—Van Thu Nguyen
Assistant Examiner—Doug Menz
(74) Attorney, Agent, or Firm—Laurence A. Greenberg; Werner H. Stemer; Gregory L. Mayback

(57) ABSTRACT

On a substrate, first and second electrical connecting elements of an integrated circuit are disposed next to one another along a first direction. The first electrical connecting element is at a first distance from the second electrical connecting element. First and interconnects are disposed on the substrate, the first interconnect being connected to the first electrical connecting element and the second interconnect being connected to the second electrical connecting element. Third and fourth electrical connecting elements are disposed on the substrate and the first and second interconnects are disposed between the third and fourth electrical connecting elements and therebetween are at a second distance from one another, the second distance being smaller than the first distance.

11 Claims, 4 Drawing Sheets

INTEGRATED CIRCUIT HAVING ELECTRICAL CONNECTING ELEMENTS

CROSS-REFERENCE TO RELATED APPLICATION

This application is a continuation of copending International Application No. PCT/DE02/00822, filed Mar. 7, 2002, which designated the United States and was not published in English.

BACKGROUND OF THE INVENTION

Field of the Invention

The present application relates to an integrated circuit having electrical connecting elements that each have a first conductivity state or a different, second conductivity state that can be brought about by impressing energy.

Electrical connecting elements that have a first state or a second state are also referred to as fuses. In such a case, a distinction is made between, for example, laser fuses and electrical fuses. Laser fuses are programmed by the light emitted by a laser. In contrast thereto, electrical fuses are programmed by an electric current that flows through the fuses. In the case of electrical fuses, a distinction is made between fuses and antifuses, depending on whether the electrical connecting element is conducting or non-conducting in the non-programmed state. Fuses are usually only one-time programmable.

Fuses are used, for example, in integrated circuits in order, after a functional test, to replace a defective function block of the integrated circuit by a redundant function block. Laser fuses are usually configured such that they firstly form a conducting connection. A laser programs a laser fuse by a laser beam destroying the conducting connection. From a general standpoint, it is possible to form fuses from any desired conducting material. By way of example, the fuses can be produced from a metal. The fuses are usually disposed in a delimited region of the substrate surface. This region is referred to, for example, as laser fuse bay or fuse bank. The fuses disposed in the fuse bank are usually at a predetermined distance from one another. If the fuses are disposed at an excessively small distance from adjacent fuses, then it is possible, during the programming of a fuse, for an adjacent fuse to be damaged by the absorption of reflected or direct laser light. Equally, it is possible for a fuse that has already been programmed and, thus, severed to be short-circuited by material that is released during the programming of a fuse adjacent thereto.

The need to comply with a relatively large distance between adjacent fuses will lead to problems in the future because the area that can be utilized for an integrated circuit is continually being reduced so that the laser fuse bay must, likewise, be reduced in size.

It is known from the prior art that the distance between two adjacent fuses can be reduced if so-called staggered fuses are formed. In such a case, the material that can be severed by the laser is fabricated in a first metal layer and the lead to the laser-programmable material is fabricated in a second metallization plane that is disposed above that and, for example, is disposed nearer to the substrate surface than the first metal layer. The lead is led, for example, by a contact hole from the first wiring plane (first metal layer) to the second wiring plane (second metal layer). In the case of staggered fuses, it is problematic that, during the programming of a fuse, the laser beam can damage the leads for adjacent fuses that are disposed in the deeper wiring planes.

SUMMARY OF THE INVENTION

It is accordingly an object of the invention to provide an integrated circuit having electrical connecting elements that overcomes the hereinafore-mentioned disadvantages of the heretofore-known devices of this general type and that is space-saving and, in the case of programming by a laser, avoids damage to adjacent interconnects or fuses.

With the foregoing and other objects in view, there is provided, in accordance with the invention, an integrated circuit has electrical connecting elements that each have a first conductivity state or a different, second conductivity state that can be brought about by impressing energy, including:

- a substrate having a substrate surface, which has a first extension direction and a second extension direction, running perpendicularly thereto;
- a first electrical connecting element and a second electrical connecting element, which, as seen in the second direction, are disposed next to one another above the substrate surface in a first wiring plane;
- a third electrical connecting element and a fourth electrical connecting element, which, as substantially seen in the second direction, are disposed next to one another on the substrate surface;
- one end of the third electrical connecting element and one end of the fourth electrical connecting element being spaced apart along the first direction from one end of the first electrical connecting element and one end of the second electrical connecting element;
- the first electrical connecting element, as seen in the second direction, being at a first distance from the second electrical connecting element;
- a first interconnect, which is disposed above the substrate surface and is connected to the first electrical connecting element;
- a second interconnect, which is disposed above the substrate surface and is connected to the second electrical connecting element;
- the first interconnect and the second interconnect being disposed between the third electrical connecting element and the fourth electrical connecting element and therebetween having a second distance, which is smaller than the first distance;
- and the first interconnect being disposed in the first wiring plane and the second interconnect being disposed at least partly in a second wiring plane, which is located nearer to the substrate surface than the first wiring plane.

One advantage of the configuration according to the invention is that the electrical connecting elements are spaced apart on the substrate surface by a first distance that is, advantageously, chosen to avoid damage to fuses during the programming of an adjacent fuse. Furthermore, interconnects are disposed on the substrate surface such that they are at a smaller distance than the electrical connecting elements connected to them. This has the advantage that interconnects can be disposed very compactly on the substrate surface. In addition, the interconnects are disposed on the substrate surface such that they run between two adjacent electrical connecting elements.

The distance between the electrical connecting elements is, advantageously, likewise chosen such that an adjacent, already programmed fuse is not short-circuited by material that is removed during the programming of the fuse. The configuration according to the invention makes it possible to reduce the substrate surface required for a fuse bank, with the number of electrical connecting elements in the fuse bank kept constant.

In accordance with a further feature of the invention, the first interconnect and the second interconnect are disposed next to one another as seen in the direction of a normal to the substrate, the normal being disposed perpendicular to the substrate surface. As a result, two or more interconnects are disposed one above the other on the substrate surface between two electrical connecting elements. Such a configuration has the advantage that the interconnects that are connected to electrical connecting elements can be formed very compactly and closely adjacent to one another.

In accordance with another feature of the invention, the first and second interconnects are disposed in an at least partly overlapping manner as seen in a direction of a normal to the substrate, the normal being disposed perpendicular to the substrate surface.

In the integrated circuit, a first wiring plane and a second wiring plane are disposed on the substrate surface, the first wiring plane being at a different distance from the substrate surface than the second wiring plane. Towards the substrate surface, the first wiring plane is at a greater distance than the second wiring plane. The second wiring plane is located nearer to the substrate surface than the first wiring plane. The first wiring plane is expediently the topmost wiring plane of the integrated circuit. This enables a space-saving configuration of interconnects because interconnects can be spaced apart from one another in the direction of the normal to the substrate, with the result that the interconnects can be stacked one above the other with respect to the substrate surface and, consequently, it is possible to dispose a plurality of interconnects with the substrate surface requirement of a single interconnect.

The first electrical connecting element, the second electrical connecting element, and the first interconnect are disposed in the first wiring plane, and the second interconnect is disposed at least partly in the second wiring plane. Such construction enables a space-saving configuration of interconnects that are connected to electrical connecting elements.

In accordance with an added feature of the invention, the second interconnect has a first section connected to the second connecting element and running in the first wiring plane and a second section running in the second wiring plane, and a contact connects the first and second sections of the second interconnect to one another, the contact running from the first wiring plane to the second wiring plane.

In accordance with an additional feature of the invention, there is provided an insulation layer isolating the first and second wiring planes from one another, the contact being led through the insulation layer substantially in a direction running vertically with respect to the substrate surface.

In accordance with yet another feature of the invention, there is provided a plurality of the electrical connecting elements are disposed next to one another as seen in the second direction, each of the plurality of electrical connecting elements have first and second leads in a course of the first direction, and the first leads are connected to one another.

In accordance with yet a further feature of the invention, a plurality of electrical connecting elements are disposed next to one another along the second direction, the electrical connecting elements each having a first lead and a second lead in the course of the first direction and the first leads of the plurality of electrical connecting elements being connected to one another. Such a configuration makes it possible for the electrical connecting elements to be connected by a common and, thus, space-saving lead to an electrical potential that, depending on the programmed state of the electrical connecting element, is present at the second terminal of the electrical connecting element or is not present when the electrical connecting element is interrupted.

In accordance with a concomitant feature of the invention, there are provided further connecting elements, which are in each case at least at the first distance from one another, to be disposed next to the first electrical connecting element and the second electrical connecting element as seen in the second direction.

The terminal interconnects—running in different planes—for the connecting elements are connected to one another through a, preferably, vertically oriented contact. The contact is led through an insulation layer that insulates the wiring planes from one another.

Other features that are considered as characteristic for the invention are set forth in the appended claims.

Although the invention is illustrated and described herein as embodied in an integrated circuit having electrical connecting elements, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
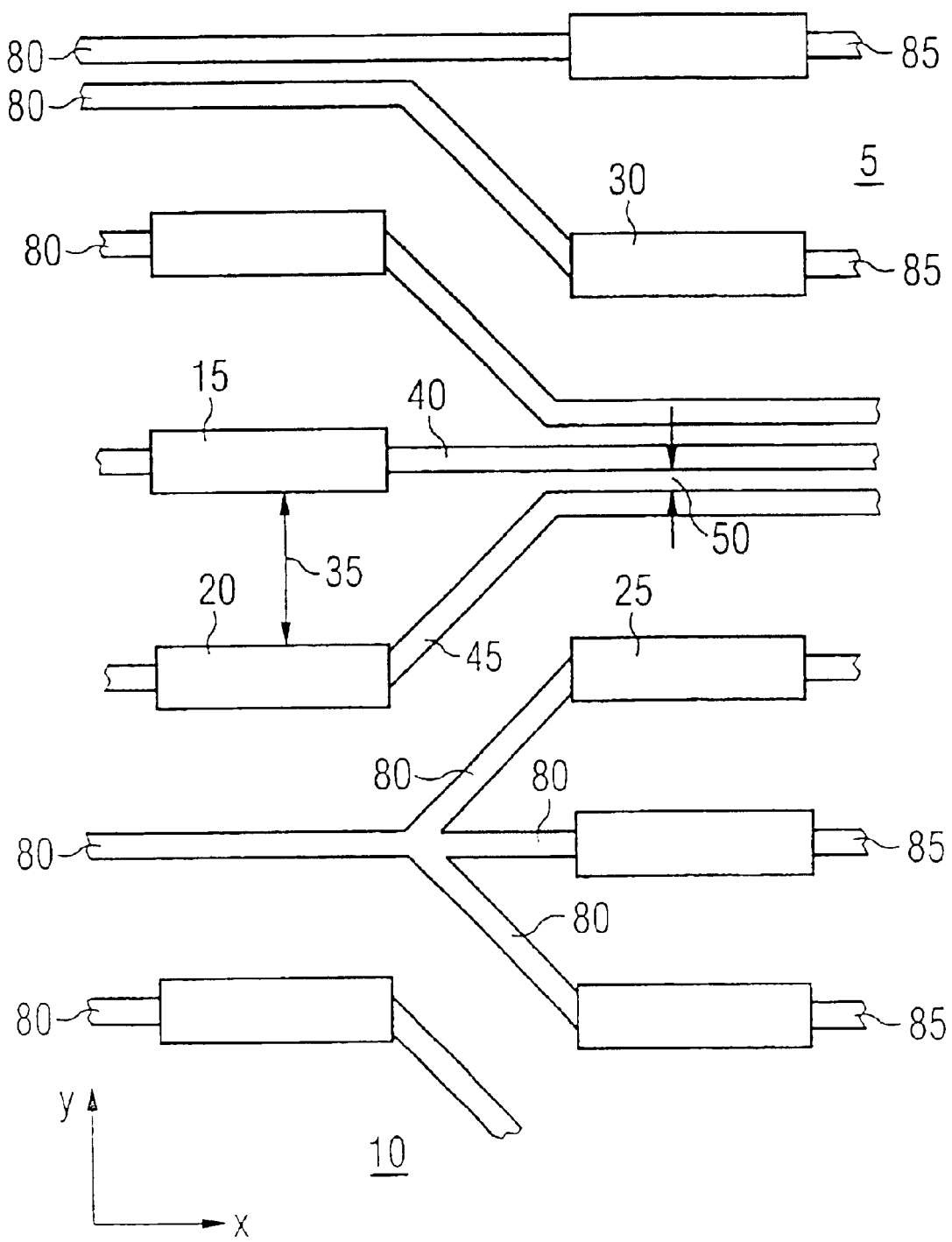
FIG. 1 is a fragmentary, plan view of a configuration of electrical connecting elements and interconnects that contact-connect the electrical connecting elements according to the invention.

Referring now to the figures of the drawings in detail and first, particularly to FIG. 1 thereof, there is shown a substrate 5 having a substrate surface 10. The substrate surface 10 has a first extension direction X and a second extension direction Y, disposed perpendicular to the first direction X. On the substrate surface 10, a first electrical connecting element 15 and a second electrical connecting element 20 are disposed next to one another along or as seen in the first direction Y. This means that the position of the connecting element 15 emerges from the position of the connecting element 20 by parallel displacement along the direction Y. This means that all horizontal illustrated edges of the connecting elements 15, 20 in FIG. 3 run parallel to one another, while the vertically illustrated edges run along an identical straight line aligned with one another.

A third electrical connecting element 25 and a fourth electrical connecting element 30 are disposed on the substrate surface 10 substantially in a manner displaced parallel to one another along the second direction Y.

The third electrical connecting element 25 and the fourth electrical connecting element 30 are spaced apart from the first electrical connecting element 15 and the second electrical connecting element 20 along the first direction X.

The left-hand ends of the connecting elements 25, 30 and the right-hand ends of the connecting elements 15, 20 are at a distance from one another. In such a case, the left-hand ends of the connecting elements 25, 30 are disposed on the right beside the right-hand ends of the connecting elements 15, 20.

The first electrical connecting element 15 and the second electrical connecting element 20 are at a first distance 35 along the second direction Y. The first electrical connecting element 15 is connected to a first interconnect 40, which is disposed on the substrate surface 10. The second electrical connecting element 20 is connected to a second interconnect 45, which is disposed on the substrate surface 10. The first interconnect 40 and the second interconnect 45 are disposed between the third electrical connecting element 25 and the fourth electrical connecting element 30 and are at a second distance 50 from one another there. The second distance 50 is smaller than the first distance 35.

The third electrical connecting element 25 and the fourth electrical connecting element 30 are disposed substantially in a manner displaced with respect to one another along the second direction Y. This means that, for example, the connecting line between the centroid of the third electrical connecting element 25 and of the fourth electrical connecting element 30 has an angle with respect to the second direction Y which may be between 0° and 45°.

The electrical connecting elements disposed on the substrate surface 10 have a first lead 80 and a second lead 85, which substantially run along the first direction X. By way of example, the first leads 80 can be connected to one another, as is shown, for the third electrical connecting element 25 to the connecting elements adjacent to it. This has the advantage that almost half the leads to the fuse bank can be obviated if they are replaced by a common lead.

The electrical connecting elements or fuses that are illustrated in FIG. 1 are disposed in a matrix-like manner. In such a case, the co-ordinates of the matrix are not fully occupied by fuses, rather, some fuses are spared so that interconnects can be disposed there on the substrate surface 10.

Figure 2:
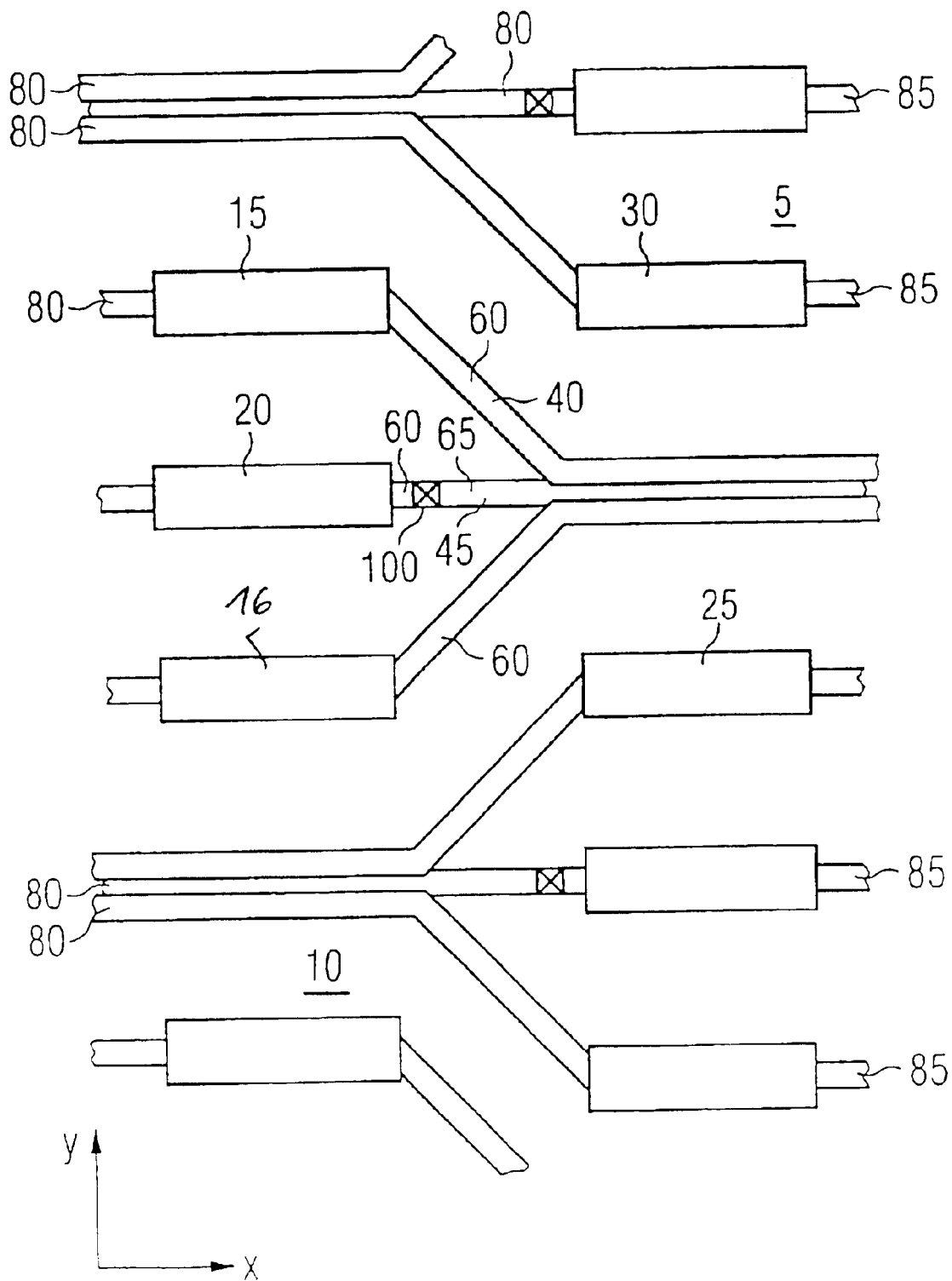
FIG. 2 is a fragmentary, plan view of a second configuration of electrical connecting elements that are contact-connected with a configuration of interconnects differing from FIG. 1.

FIG. 2 illustrates a configuration of electrical connecting elements in accordance with FIG. 1 in which, however, the interconnects connected to the electrical connecting elements run in a different manner from that in FIG. 1. A first wiring plane 60 and a second wiring plane 65 are disposed on the substrate surface 10. The first wiring plane 60 is at a third distance 70 (see FIGS. 4 and 5) from the substrate surface 10 and the second wiring plane 65 is at a fourth distance 75 from the substrate surface 10. In such a case, the third distance 70 is different from the fourth distance 75. By way of example, the first electrical connecting element 15, the second electrical connecting element 20, and the first interconnect 40 are disposed in the first wiring plane 60 and the second interconnect 45 is disposed at least partly in the second wiring plane 65. A contact plug 100 is disposed as connecting element within the second interconnect 45, between the first wiring plane 60 and the second wiring plane 65.

Furthermore, the illustration shows that, in contrast to FIG. 1, the first interconnect 40 runs above the second interconnect 45, thereby enabling a space saving of substrate surface 10. In a perpendicular plan view of the substrate surface, the interconnect 45 running in the second, lower wiring plane is partly covered by the two terminal interconnects—running in the first, upper wiring plane—to the connecting elements 15, 16 disposed directly adjacent to the wiring element 20.

Figure 3:
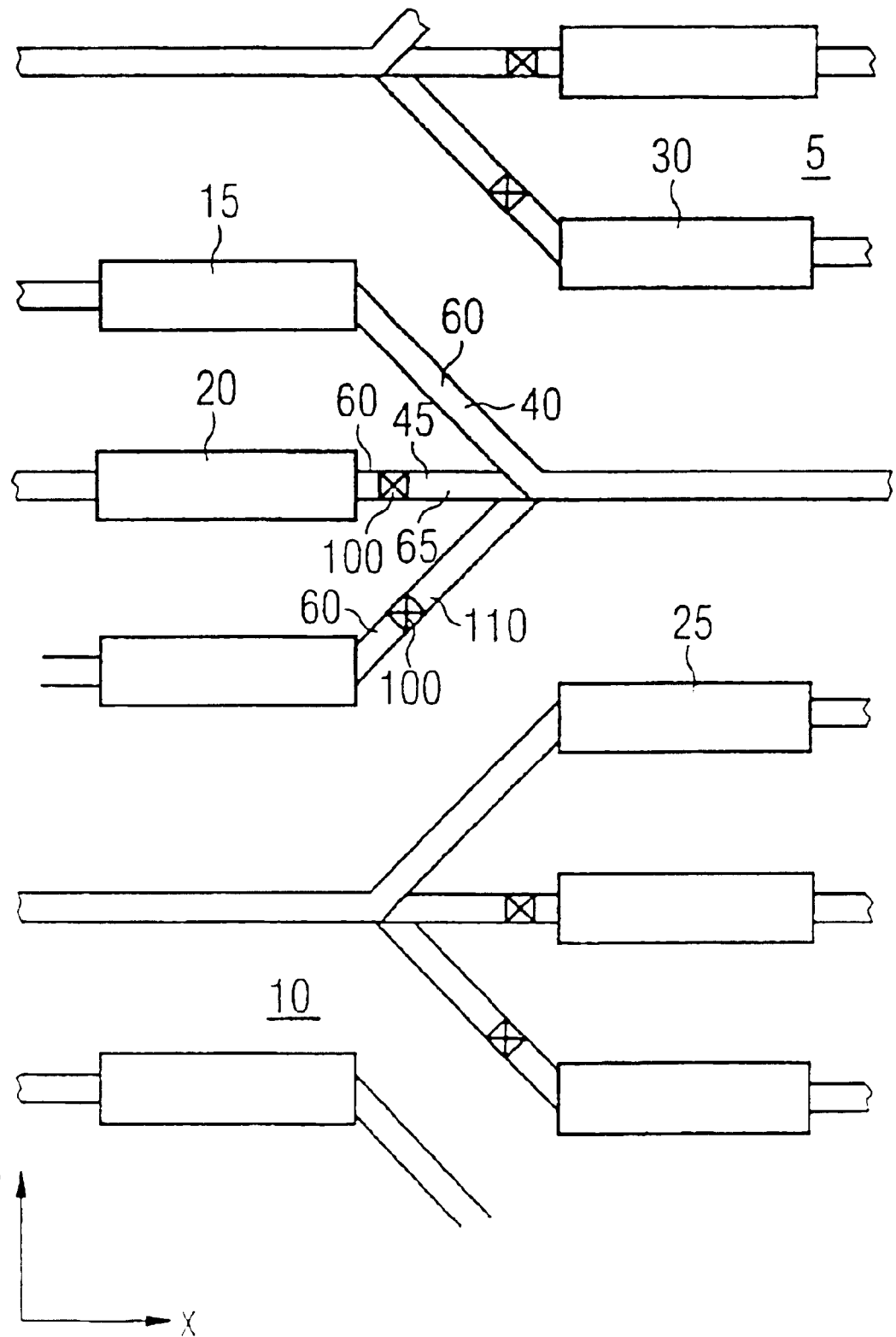
FIG. 3 is a fragmentary, plan view of a third configuration of electrical connecting elements according to the invention that are contact-connected with interconnects disposed in a plurality of wiring planes.

FIG. 3 illustrates a further exemplary embodiment of the invention. In the case of FIG. 3, the interconnects connected to the electrical connecting elements are disposed in a first wiring plane 60, a second wiring plane 65, and a third wiring plane 110. Such a configuration enables three interconnects for the connection of the electrical connecting elements to run one above the other and, thus, to be disposed in a space-saving manner. Within an interconnect, the different wiring planes are connected to one another by contact plugs 100.

Figure 4:
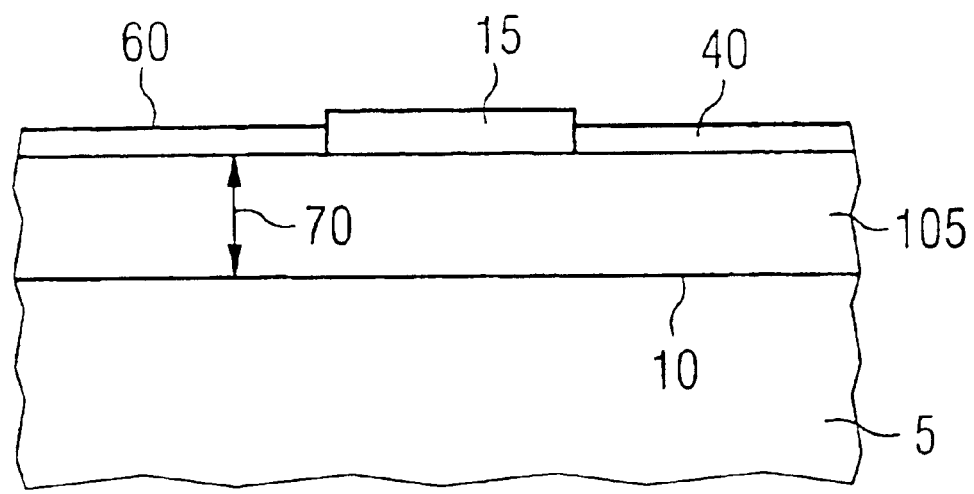
FIG. 4 is a fragmentary, cross-sectional view of a substrate with an electrical connecting element and interconnects according to the invention.

FIG. 4 illustrates a section through the substrate 5. The substrate 5 has a substrate surface 10, on which an insulation layer 105 is disposed. Disposed on the insulation layer 105 is a first wiring plane 60, in which, for example, the first electrical connecting element 15 and the first interconnect 40 are disposed. The first wiring plane 60 is at the third distance 70 from the substrate surface 10.

Figure 5:
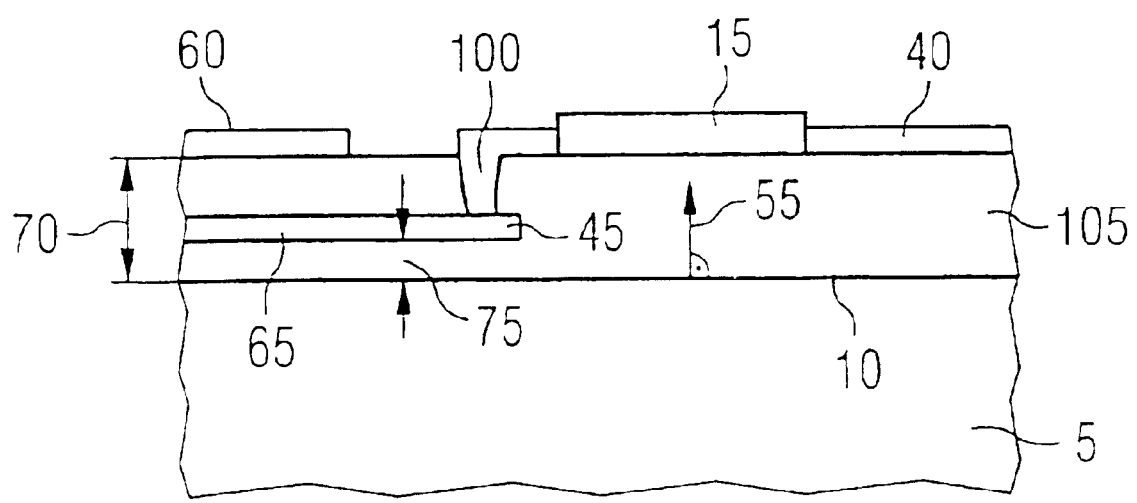
FIG. 5 is a fragmentary, cross-sectional view of a substrate with an electrical connecting element and interconnects that are disposed in a first wiring plane and a second wiring plane according to the invention.

FIG. 5 illustrates a further section through the substrate 5. The substrate 5 has the substrate surface 10 on which the insulation layer 105 is disposed. The first electrical connecting element 15 with the first interconnect 40 is illustrated on the insulation layer 105. A normal 55 to the substrate surface 10 is illustrated on the substrate surface 10, the normal 55 being perpendicular to the substrate surface 10. The first electrical connecting element 15 and the first interconnect 40 are disposed in the first wiring plane 60 which is at the third distance 70 from the substrate surface 10. Furthermore, the second wiring plane 65 is illustrated, which is at the fourth distance 75 from the substrate surface 10. The insulation layer 105 insulates the wiring planes 60, 65 from one another. The contact plug 100 connects the second wiring plane 65 to the first wiring plane 60 and the first electrical connecting element 15. In such a case, the third distance 70 is made larger than the fourth distance 75. The contact 100 substantially runs along the normal 55, that is to say, directed perpendicular to the substrate surface 10.

Configurations are, likewise, conceivable in which more than two or, else, more than five electrical connecting elements are disposed in a group, adjacent electrical connecting elements of a group in each case being at a distance from one another that corresponds to the first distance 35. All of the wiring planes of a semiconductor component can be used for the wiring of the individual connecting elements.

We claim:

1. An integrated circuit, comprising:
   electrical connecting elements each having one of a first conductivity state and a second conductivity state different from said first conductivity state, said first and second conductivity states being brought about by impressing energy;
   a substrate having a substrate surface with a first extension direction and a second extension direction running perpendicular to said first extension direction;
   first and second connecting elements of said electrical connecting elements, as seen in said second extension direction, being disposed next to one another above said substrate surface in a first wiring plane, said first connecting element having an end, said second connecting element having an end;

third and fourth connecting elements of said electrical connecting elements, as substantially seen in said second extension direction, being disposed next to one another on said substrate surface, said third electrical connecting element having an end, said fourth electrical connecting element having an end, said ends of said third and fourth connecting elements being spaced apart along said first extension direction from said ends of said first and second electrical connecting elements;

said first electrical connecting element, as seen in said second direction, being at a first distance from said second electrical connecting element;

a first interconnect:
being disposed above said substrate surface;
being connected to said first electrical connecting element; and
being disposed in said first wiring plane;

a second interconnect:
being disposed above said substrate surface;
being connected to said second electrical connecting element; and
being disposed at least partly in a second wiring plane located nearer to said substrate surface than said first wiring plane; and said first and said second interconnects:
being disposed between said third and fourth electrical connecting elements; and
defining a second distance therebetween smaller than said first distance.

2. The integrated circuit according to claim 1, wherein said first and second interconnects are disposed in an at least partly overlapping manner as seen in a direction of a normal to said substrate, said normal being disposed perpendicular to said substrate surface.

3. The integrated circuit according to claim 1, wherein:
said second interconnect has:
a first section connected to said second connecting element and running in said first wiring plane; and
a second section running in said second wiring plane; and
a contact connects said first and second sections of said second interconnect to one another, said contact running from said first wiring plane to said second wiring plane.

4. The integrated circuit according to claim 2, wherein:
said second interconnect has:
a first section connected to said second connecting element and running in said first wiring plane; and
a second section running in said second wiring plane; and
a contact connects said first and second sections of said second interconnect to one another, said contact running from said first wiring plane to said second wiring plane.

5. The integrated circuit according to claim 3, further comprising an insulation layer isolating said first and second wiring planes from one another, said contact being led through said insulation layer substantially in a direction running vertically with respect to said substrate surface.

6. The integrated circuit according to claim 4, further comprising an insulation layer isolating said first and second wiring planes from one another, said contact being led through said insulation layer substantially in a direction running vertically with respect to said substrate surface.

7. The integrated circuit according to claim 3, further comprising an insulation layer isolating said first and second wiring planes from one another, said contact being led through said insulation layer substantially in a direction normal to said substrate surface.

8. The integrated circuit according to claim 4, further comprising an insulation layer isolating said first and second wiring planes from one another, said contact being led through said insulation layer substantially in a direction normal to said substrate surface.

9. The integrated circuit according to claim 1, wherein:
a plurality of said electrical connecting elements are disposed next to one another as seen in said second direction;
each of said plurality of electrical connecting elements have first and second leads in a course of said first direction; and
said first leads are connected to one another.

10. The integrated circuit according to claim 1, wherein:
a plurality of said electrical connecting elements are disposed next to one another as seen in said second direction;
each of said plurality of electrical connecting elements have first and second leads extending in said first direction; and
said first leads are connected to one another.

11. The integrated circuit according to claim 1, further comprising other connecting elements each respectively disposed at least at said first distance from one another, said other connecting elements being disposed next to said first and second electrical connecting elements as seen in said second direction.

* * * * *